United States Patent [19]
Jousselin et al.

[11] Patent Number: 5,241,509
[45] Date of Patent: Aug. 31, 1993

[54] ARRANGEMENT OF DATA CELLS AND NEURAL NETWORK SYSTEM UTILIZING SUCH AN ARRANGEMENT

[75] Inventors: Christian P. M. Jousselin, Puteaux; Marc A. G. Duranton, Boissy Saint Leger, both of France

[73] Assignee: U.S. Philips Corporation, New York, N.Y.

[21] Appl. No.: 879,233

[22] Filed: May 6, 1992

Related U.S. Application Data

[62] Division of Ser. No. 755,653, Oct. 10, 1991, Pat. No. 5,151,971, which is a division of Ser. No. 439,717, Nov. 20, 1989, Pat. No. 5,075,889.

[51] Int. Cl.$^5$ .............................................. G11C 13/00
[52] U.S. Cl. ........................... 365/230.01; 365/189.04
[58] Field of Search .................. 365/230.04, 182, 207, 365/189.01, 189.04, 189.08, 230.01, 230.05, 230.09

[56] References Cited

FOREIGN PATENT DOCUMENTS 8400629 2/1984 PCT Int'l Appl. .

OTHER PUBLICATIONS

S. C. J. Garth, "A chipset for High Speed Simulation of Neural Network Systems", IEEE Conf. Neural Networks (San Diego 1987) pp. III-443–III-452.
French Search Report of Sep. 21, 1989.
European Search Report of Dec. 21, 1989.

Primary Examiner—Terrell W. Fears
Attorney, Agent, or Firm—Anne E. Barschall

[57] ABSTRACT

An arrangement of data cells which stores at least one matrix of data words which are arranged in rows and columns, the matrix being distributed in the arrangement in order to deliver/receive, via a single bus, permuted data words which correspond either to a row or to a column of the matrix. Each data cell is connected to the single bus via series-connected switches which are associated with a respective addressing mode, the switches which address a same word of a same mode being directly controlled by a same selection signal. Circulation members enable the original order of the data on the bus to be restored. An arrangement of this kind is used in a layered neural network system for executing the error backpropagation algorithm.

6 Claims, 4 Drawing Sheets

ARRANGEMENT OF DATA CELLS AND NEURAL NETWORK SYSTEM UTILIZING SUCH AN ARRANGEMENT This is a division of application Ser. No. 07/775,653, filed on Oct. 10, 1991, now U.S. Pat. No. 5,151,971, which is a division of Ser. No. 07/439,717, filed on Nov. 20, 1989, now U.S. Pat. No. 5,075,889.

BACKGROUND OF THE INVENTION

The invention relates to an arrangement of data cells which stores at least one matrix of data words which are arranged in rows and columns, the matrix being distributed in the arrangement in order to deliver/receive, via a single bus and by means of mode selection means, permuted data words which correspond either to a row or to a column of the matrix.

The invention also relates to a neural network system utilizing such an arrangement.

The document WO 84/00629 discloses a memory system with multi-dimensional access. This document relates to the writing and reading of a two-dimensional data table stored in a memory. In order to enable the addressing of the data words either rows-wise or column-wise in the table, the data is arranged in the memory in a special way so that it can be read/written by means of a single bus. To this end, the data is loaded one row after the other, the first row loaded corresponding to the first row of the table, the second row loaded corresponding to the second row of the table, the data of one memory block having been subjected to a circular permutation. Each row loaded is thus shifted through one memory block with respect to the preceding row and hence subjected to the corresponding circular permutation. The data which was arranged in a column of the table is thus arranged along a diagonal of the memory. The data which was situated in a row of the table is still situated in the row of the same rank of the memory, but with a given circular permutation. For the addressing of a row or a column of the table, distributed over several memory columns, it is thus necessary to determine each time the real address in the memory by means of an address modifier. The data which appears with a given permutation can be reestablished in the initial order by means of a member which performs the rotation of the data. Each address modifier associated with each column performs an address calculation which depends on the row and the column of the table and on the column of the memory. Such calculations necessitate a large quantity of hardware which has the drawback that it delays the calculation of the real addresses and that it is too elaborate to enable a compact integrated realization.

SUMMARY OF THE INVENTION

The problem, therefore, is to realize an arrangement of the type described above which is fast and which can be integrated in a compact manner. The solution to this problem consists of an arrangement for which each data cell is connected to the single bus via switches which are connected in series and which are associated with each addressing mode, the switches addressing a same word of a same mode being directly controlled by a same selection signal.

Thus, a single line carrying a single mode selection signal can address an entire given word by simultaneously activating all relevant switches for each bit of a word. Each switch may be formed by a selection transistor. This increases the compactness and the speed of the arrangement notably because when it is realized as an integrated circuit.

The matrix of data words can be diagonally distributed in the arrangement so that one row (one column) of the matrix is distributed diagonally in the arrangement, the other rows (other columns) of the matrix being distributed parallel to said diagonal.

The bits constituting the data words appear on the bus in an order which deviates from their order in the data words of the matrix. In order to reestablish this order, therefore, a sorting operation is required; this operation is performed by a circulation shift register which is controlled by a circulation member which shifts the data along the addressed row of the matrix. This sorting of data on the bus can also be performed by an adder which determines an internal address of the buffer circuit by adding a predetermined value, belonging to the addressed row in the arrangement, to an external address of the buffer circuit.

When distribution of several matrices of data words is desired, this can be realized in a two dimensional or a multi-dimensional arrangement. In the latter case each dimension has its selection mode. Thus, there may be three selection modes X, Y, Z in a three-dimensional arrangement.

The importance of a compact and fast realization becomes manifest notably in systems necessitating the storage of a large number of tables which may have large dimensions. This is the case, for example in neural network systems. An as dense as possible integration with high processing speeds is then required.

The neural networks are formed by elementary functional units which are interconnected by synapses with which synaptic coefficients are associated. A neural network performs resolving steps during which the states $V_j$ of output neurons j are determined on the basis of states $V_i$ of input neurons i. This resolving phase takes place in accordance with:

$$V_j = \sum_i C_{ij} V_i$$

However, for adaptation to a given task the neural network must also perform training steps. Such a neural network is described, for example in the document "A chipset for high speed simulation of neural network systems", S. C. J. Garth, IEEE Conference on Neural Networks, Dan Diego III-443 (1987). The training steps serve to modify the synaptic coefficients so as to adapt the network to a given problem.

For performing the training algorithm according to error backpropagation, the neural network has a layered structure. During a step of the "resolving" type, states of output neurons are determined by means of synaptic coefficients stored in the network. Subsequently, a host computer compares the states of the output neurons determined with the states of the neurons considered. The errors observed are introduced into the last layer of the network, after which they are backpropagated with a propagation direction which has been reversed with respect to the resolving mode. For successively performing a resolving step and subsequently a training step, use is made of synaptic coefficients according to a matrix $C_{ij}$ in the resolving step and according to a matrix $C_{ji}$, being the transposed matrix $C_{ij}$, during the training step as disclosed in the document by S. C. J. Garth.

For each change-over between the steps this necessitates the execution of repeated loading operations for the storage means for the synaptic coefficients by either the matrix $C_{ij}$ or the transposed matrix $C_{ji}$.

The execution of these loading operations requires a large amount of time.

The number of calculations to be performed being very large, the speed can be increased by performing a parallel processing operation. To this end it must be possible to read/write the matrix $C_{ij}$ in blocks of rows or columns, depending on the relevant step.

To this end, it may be attempted to double the number of means for storing the synaptic coefficients or the number of buses, but that will be at the expense of the compactness of the system and also necessitates the use of supplementary selection means which slow down the operation.

Therefore, the invention utilizes the arrangement of data cells described above. In this case the invention relates to a layered neural network system comprising:
resolving means for determining, for each layer, the
  states of output neurons i on the basis of the states of
  input neurons j which are linked by way of synapses,
storage means for the synaptic coefficients $C_{ij}$ associated
  with these synapses,
means for training and for updating the synaptic coefficients $C_{ij}$,
means for storing the neuron states, characterized in
  that the means for storing the synaptic coefficients
  are formed by at least one arrangement of the type
  described above which stores at least one square
  matrix of synaptic coefficients $C_{ij}$ which are distributed in at least one memory which is of the dual-addressing type and comprises a single bus so that a
  word of synaptic coefficients relating to either a row
  or to a column of the square matrix can be addressed
  and placed on the single bus in order to ensure that
  the neural network system performs training steps
  either with the synaptic coefficient matrix or with the
  transposed matrix in order to execute the error backpropagation algorithm.

In a preferred version, the synaptic coefficients are diagonally distributed in a two-dimensional memory so that one row (one column) of the matrix is distributed along a diagonal of the memory, the other rows (other columns) of the matrix being distributed parallel to said diagonal.

Thus, the synaptic coefficient words preferably appear on the bus in a predetermined order and nevertheless remain easy to use in their initial order by means of a circulation shift register. To this end, the means for storing the neuron states comprise a circulation shift register which enables circulation of the neuron states in order to link each neuron state to its synaptic coefficient.

Thus, instead of resetting the synaptic coefficients in their initial order, the neuron state vectors are subjected to appropriate circular permutations.

These circular permutations are controlled by an address calculator which performs the circulation in the shift register by generating the commands corresponding to the row of the addressed synaptic coefficient word. As can be deduced from the above, the invention relates in general to a data handling system comprising a plurality of cells for upon selection communicating data with an environment, the data handling system being provided with selection means for selecting a group of cells for establishing parallel couplings between the selected cells and a single data-bus via respective data paths. Each particular cell belongs at least to a respective first group and a respective second group, that have only the particular cell in common and that can be selected in a first and a second selection mode, respectively. The selection means transmits at least a first and a second selection signal for in dependence thereon controlling the data path between each cell and the databus.

Thus, access to the cells is enabled according to predetermined patterns controlled by the two selection signals. In case the plurality of cells has been organized as a main matrix selection, modes might enable for instance a parallel row-wise data communication as regards the rows of the matrix organization and a parallel data communication as regards diagonals of for instance square submatrices in the main matrix.

This is advantageous in appliances involving data processing performed on both the data matrix and its transpose. As has been described hereinabove, an application of this kind is found in the adaptive layered neural nets that are trained according to the so-called back propagation algorithm. In general, the advantages lie in the use of a single data matrix to be stored, the parallel data communication enabling high speed, and a simple mode selection mechanism.

As already has been mentioned, each datapath may comprise a series arrangement of switches each being controlled by a respective selection signal. One can easily imagine an embodiment of the invention wherein this datapath includes a series arrangement of conduction channels of transistors that represent the switches. A practical equivalent might include a transistor controlled by a further selection signal representative of a logic function of said first and second selection signals and generated by means of a logic gate proper to each cell, thus reducing threshold and saturation losses in the datapath transistor. In case each cell stores a multibit word this architecture might save substrate area on an IC.

BRIEF DESCRIPTION OF THE DRAWING

This neural network system may form a compact integrated circuit for fast parallel processing.

The invention will be described in detail hereinafter with reference to the following Figures: therein.

DETAILED DESCRIPTION OF THE PREFERRED EMBODIMENTS

For the sake of clarity, the description is based on a two-dimensional arrangement of memory points. Its extension to three dimensions is shown in the FIGS. 6A and 6B. Higher order dimensions can be readily deduced therefrom.

Figure 1:
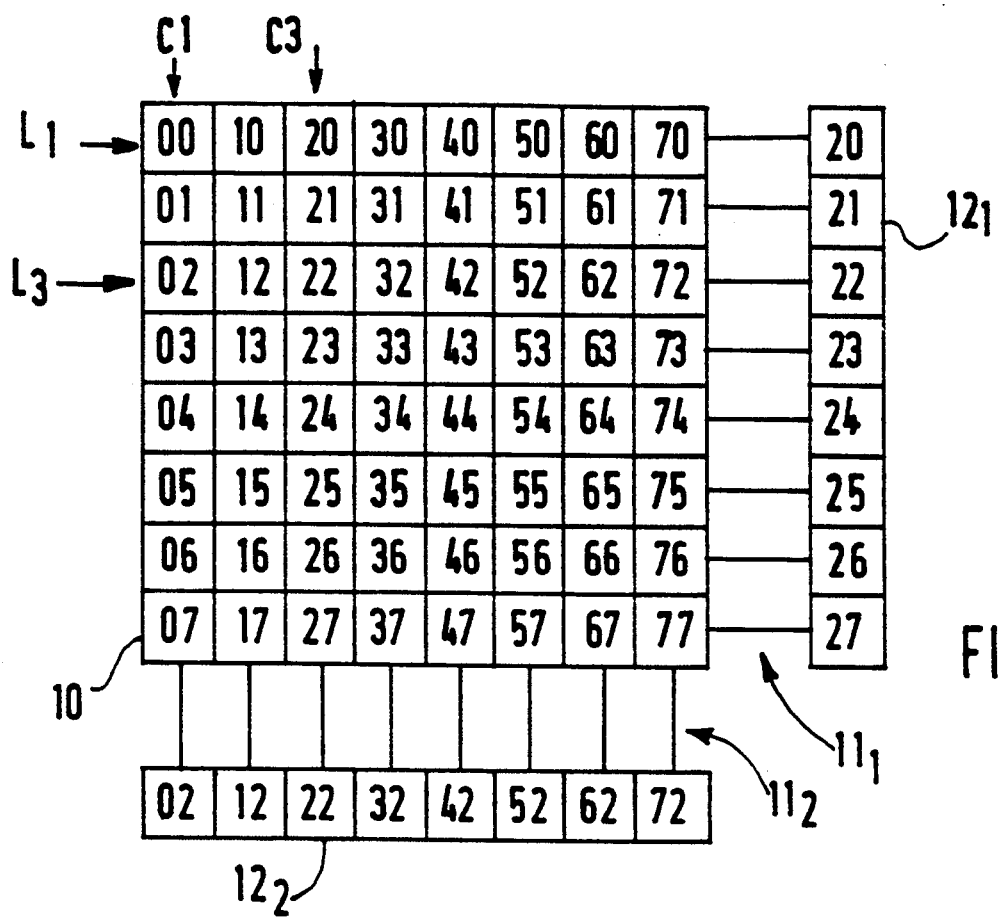
FIG. 1 shows a matrix representing an example of the arrangement of data in a conventional data arrangement.

FIG. 1 shows a matrix 10 in which the data is stored with customary row or column addressing. For the clarity of the description, the numbers stated in each block represent the data stored. In this case the rows/columns of the matrix coincide with the rows/columns of the arrangement. Thus, the row L1 contains the data 00 to 70 and the column C1 contains the data 00 to 07. The matrix can be addressed either row-wise or column-wise. Thus, if the column C3 is addressed, the data of the column appear on the bus $11_1$ and can be stored in the buffer register $12_1$. The data 20 is stored in the upper block of the register and the data 27 is stored in the lower block of the register. Moreover, if the row L3 is addressed, the data selected appears on the bus $11_2$ and can be stored in a buffer register $12_2$. The data 02 is stored in the left-hand block of the register and the data 72 is stored in the right-hand block of the register. The data of the rows or the columns thus appear on different buses, necessitating the use of different buffer circuits. If the use of a single buffer circuit is to be realized for such an arrangement, it can be achieved only at the expense of supplementary interconnections, some of which are very long, and with the addition of numerous selection elements.

Figure 2:
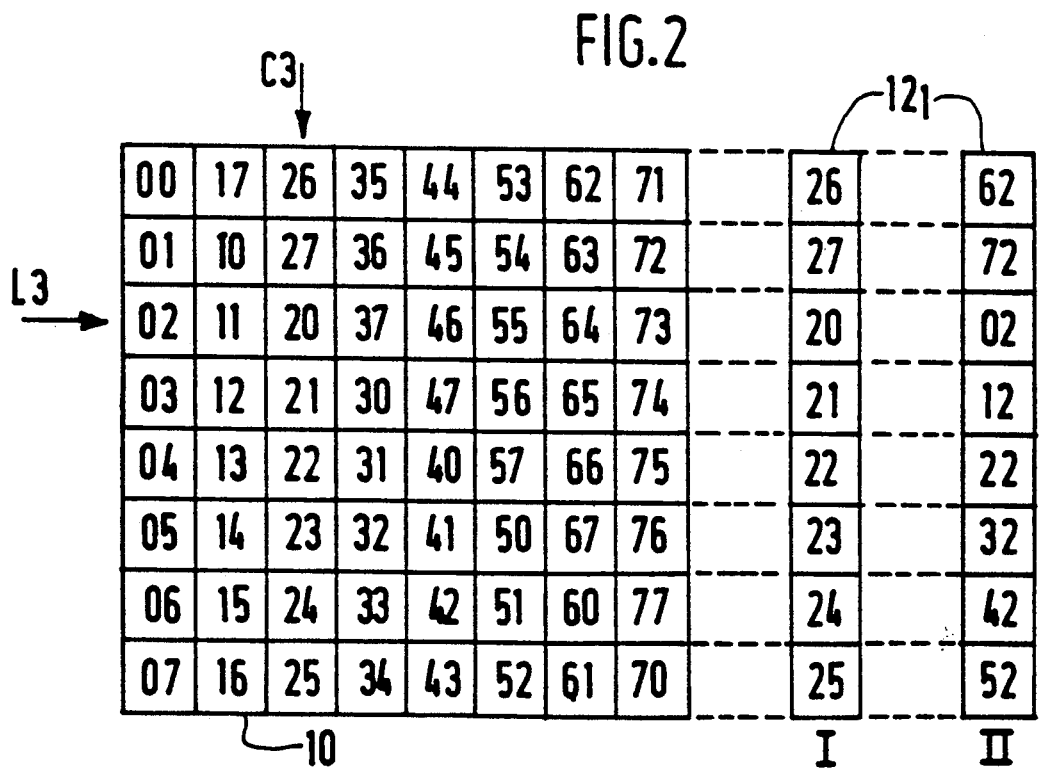
FIG. 2 shows a matrix representing an example of the arrangement of the data in accordance with the state of the art.

In accordance with the cited prior art document, the data word matrix will be disposed in the arrangement of data cells as shown in FIG. 2. Contrary to the former case, a line/row of the matrix and a line/row of the arrangement are distinguished. In this arrangement it can be observed that the data which were present on the first row of FIG. 1 are placed on the diagonal of the square matrix of FIG. 2. Each column is then arranged by placing the value of the first row of FIG. 1 in the block of FIG. 2 which is situated on the diagonal, followed by the other values, for example by displacement towards the bottom; when the bottom of the matrix is reached, the loading of the column is continued with the block of the first row. In accordance with this arrangement, when the column C3 is addressed the data of the column appear on the output bus and then possibly in the buffer register $12_1$ in the arrangement represented by I. It appears that the output data is the same as in FIG. 1, albeit in a different arrangement. Thus, the data 20 no longer appears in the upper block but in the third block of the buffer circuit $12_1$. Thus, each data is shifted over a number of positions equal to the rank number of the addressed column.

Similarly, when the row L3 is addressed, the selected data appears on the same bus and in the same buffer circuit $12_1$ as before in accordance with the arrangement represented by II. The buffer circuit $12_1$ is shown twice in FIG. 2 for the sake of clarity. It appears again that the data is the same as when the row L3 is addressed in accordance with the arrangement shown in FIG. 1, albeit again with a different arrangement. Each data is thus shifted through a number of positions equal to the rank number of the addressed row.

The example given relates to a square matrix, but the invention also holds good for rectangular matrices $M \times N$ subject to the condition that the single bus and, if necessary, the single buffer circuit are arranged at the side of the matrix which delivers the maximum bits. The memory elements which have the same diagonal address are obtained by translation of the square matrix, either $M \times M$ or $N \times N$, inscribed in the rectangular matrix $M \times N$.

Figure 4:
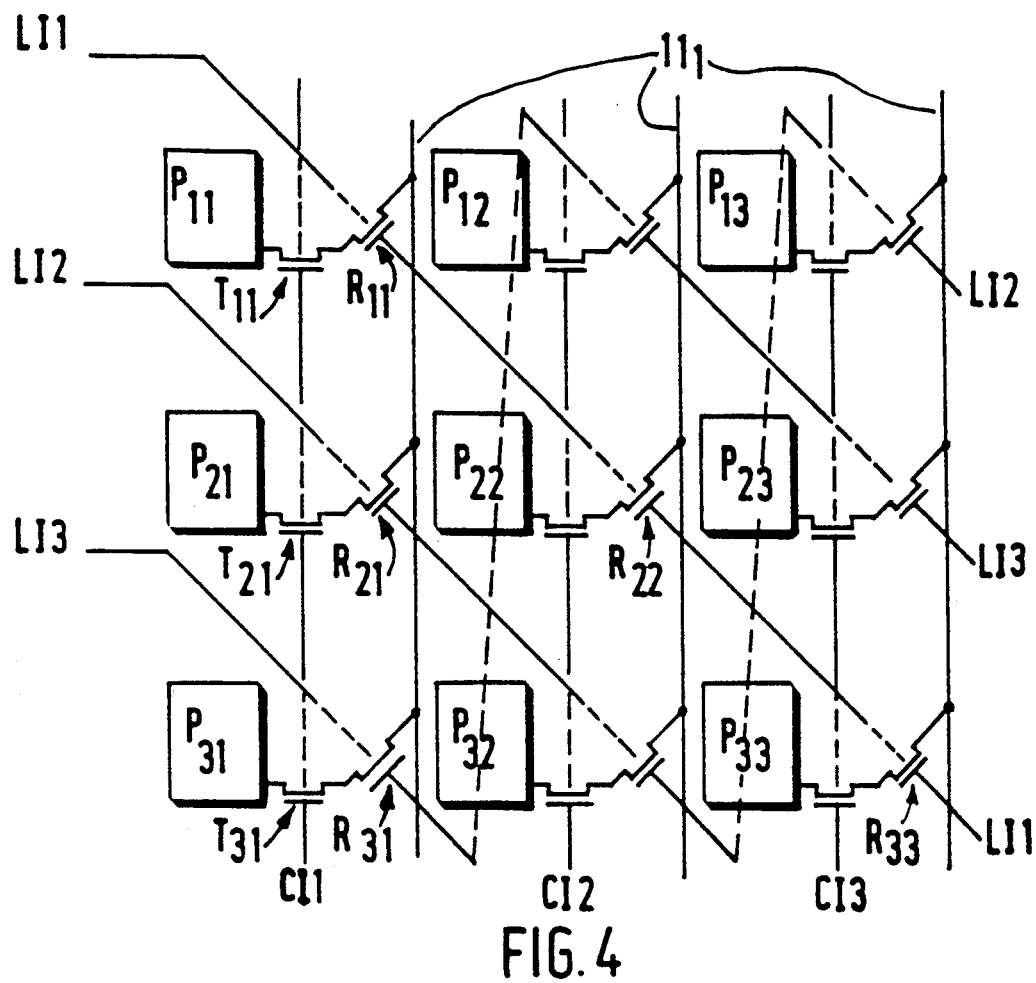
FIG. 4 shows an addressing structure for the two-dimensional memory point matrix.

FIG. 4 shows the addressing structure of the arrangement of data cells in accordance with the invention which utilizes the arrangement of the data matrix shown in FIG. 2. In this simple example, corresponding to a $3 \times 3$ arrangement, the points P11, P21, P31 of the same column are selected by the same selection signal CI1 which acts on transistors T11, T21, T31. Similarly, the signals CI2, CI3 select the other columns. The memory points P11, P22, P33 situated on the same diagonal of the arrangement (same column of the matrix) are selected by the signal LI1 which acts on the transistors R11, R22, R33. The signal LI2 acts on the points P21, P32 and P13. The signal LI3 operates on the points P31, P12 and P23. In order to perform the selection of a point, it is necessary to activate, for example either all signals LI and one of the signals CI or vice versa. The data is delivered to the bus $11_1$. Conversely, for writing it suffices to present the data on the bus $11_1$, to perform the addressing operation and to set the memory points to the write state.

Figure 6A:
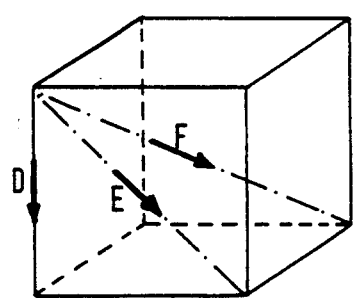
FIGS. 6A, 6B show a three-dimensional addressing structure.
Figure 6B:
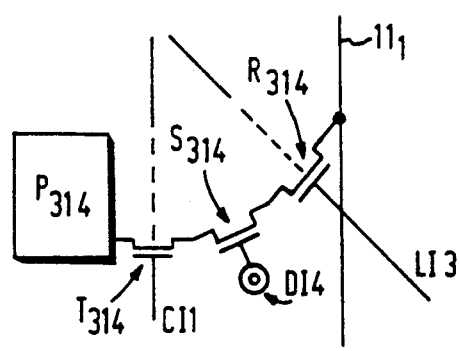

The described example concerns a two-dimensional arrangement. The FIGS. 6A and 6B show a three-dimensional arrangement of cells. In this case, in accordance with the invention (FIG. 6A) addressing can be performed, for example in a direction D corresponding to one dimension of the matrix and in one diagonal direction, for example the directions E or F. The three-dimensional matrix is represented by three indices, the direction D corresponding to points having one of the constant indices. When the addressing in the direction D concerns exclusively the part of the matrix at the front face of cube shown (a single constant index), the selected groups of cells correspond to one column of cells of this front face. When the addressing in the direction D concerns the entire three-dimensional space (two constant indices), the selected groups of cells correspond to a slice which is based on said column and which extends in the direction perpendicular to said front face. For the benefit of explanation the three-dimensional matrix is shown in the form of a cube, but it may also have an arbitrary other shape. The multidimensional arrangement can notably be topographically arranged according to one surface (two dimensions).

The second addressing operation must be performed in the diagonal directions E or F for which either two or three indices remain mutually identical. Thus, this concerns the diagonals themselves and also the rows of cells which extend parallel thereto.

With each of the dimensions of the matrix there are associated addressing means which are shown in FIG. 6B and which follow from the structure of FIG. 4. A single memory element D314 is shown. The transistors T314 (command $CI_1$), S314 (command $DI_4$), R314 (command $LI_3$) enable the addressing in the three dimensions of the matrix. A memory point, for example P314, is selected by activating, for example all commands CI and DI and only the command $LI_3$. Actually, for activating an arbitrary cell it is necessary to activate the complete addressing in two dimensions of the matrix and in the other dimension only the command relating to the relevant cell.

Figure 3A:
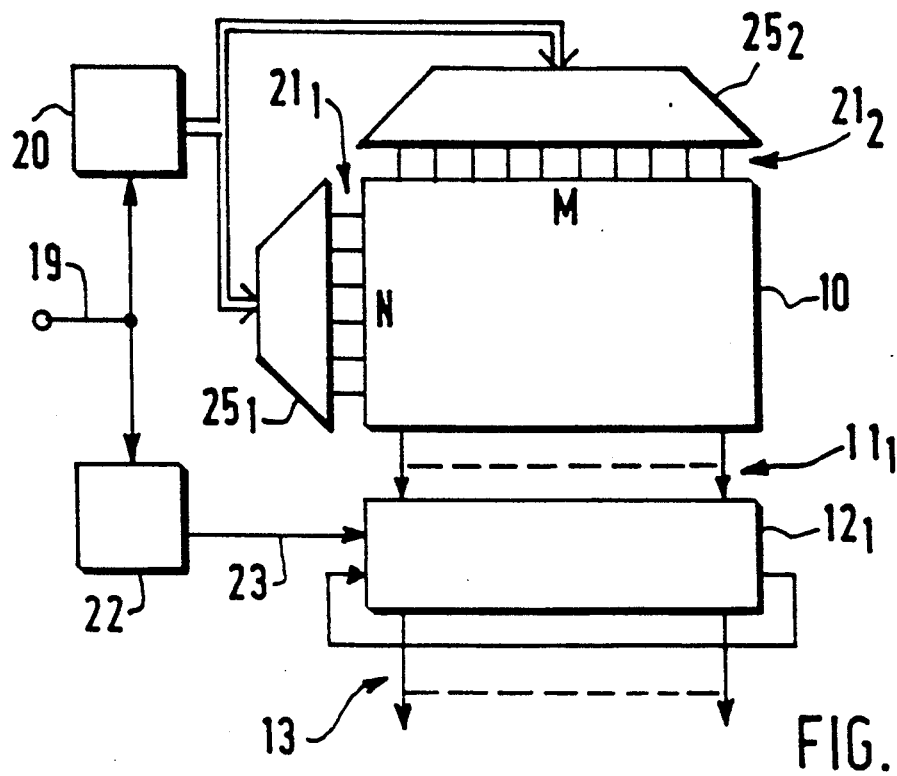
FIG. 3A shows an embodiment of means for arranging output data.
Figure 3B:
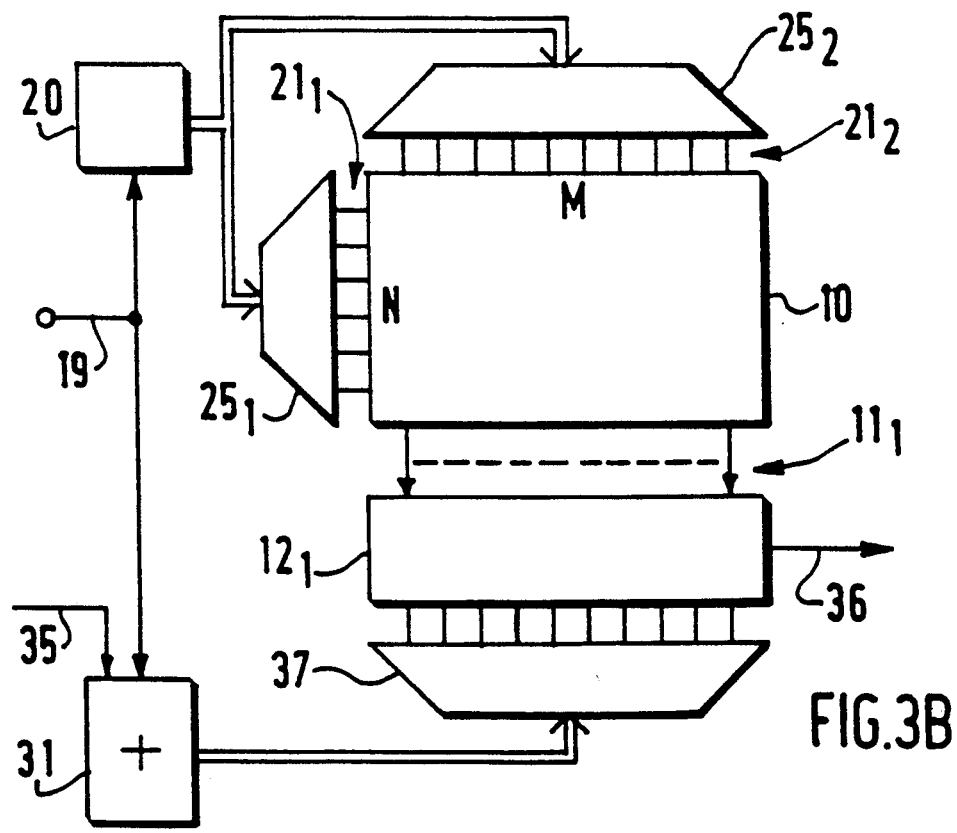
FIG. 3B shows another embodiment of means for arranging output data.

FIGS. 3A and 3B show an M×N matrix 10 provided with a single bus 11₁ which is connected to a buffer circuit 12₁ which is capable of storing slices of M bits. FIG. 3A shows a first embodiment of the means for sorting the output data. To this end, a generator 20 supplies addresses which determine the addressing of the row 21₁ and the column 21₂, under the control of an external command 19, by means of decoders 25₁ and 25₂, respectively. The same command 19 reaches a circulation member 22 which delivers, depending on the rank of the address supplied, either a row address or a column address, a circulation command 23 to the buffer circuit 12₁ which is formed by an end-around coupled shift register. Thus, the data read during the addressing operation and subsequently stored in the buffer circuit 12₁ are arranged in the desired order by this operation before being delivered to the bus 13.

FIG. 3A enables parallel data output. It may be interesting to enable series output the desired order. To this end, in FIG. 3B the output data are arranged directly by means of address decoding. To this end, the addressing command 19 for the memory 10 is applied to an adder 31 which also receives an external address 35 for reading the buffer circuit 12₁ which in this case is no longer formed by an end-around coupled shift register but by a row of memory points which is connected to a single series output 36. To the address 35 there is added a value which is contained in the command 19 and which depends on the rank of the row or the column addressed in the memory 10. The adder is connected to a decoder 30 which supplies the internal address of the desired memory point in the buffer circuit 12₁. The external address 35 may arrive from an external device or a counter which determines the addresses for the reading of the buffer circuit 12₁.

Figure 5A:
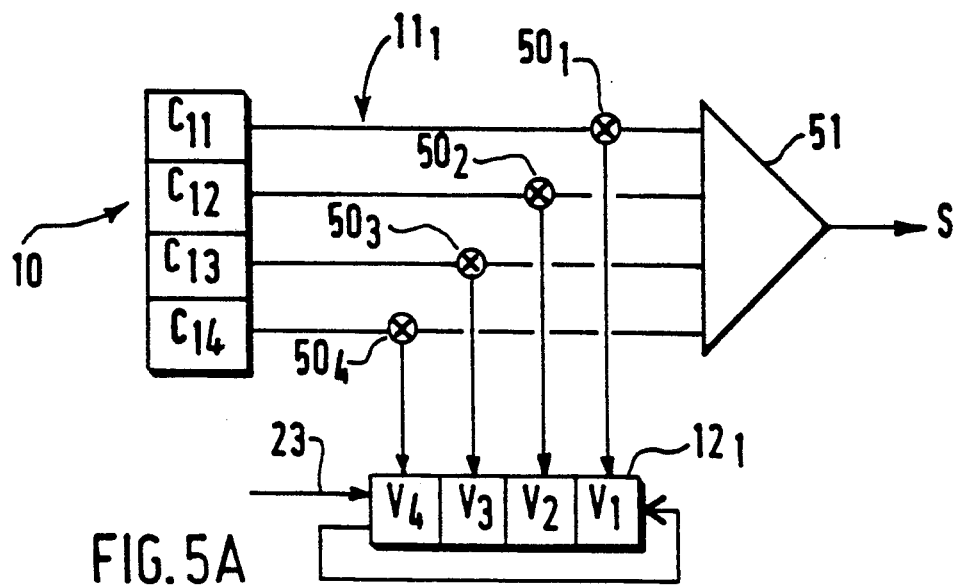
FIG. 5A shows a part of a neural network circuit in accordance with the invention.

FIG. 5A shows a part of a neutral network circuit concerning a simplified example in the case of a two-dimensional arrangement. For a neuron 1 the arrangement 10 supplies on its bus the four synaptic coefficients $C_{11}$, $C_{12}$, $C_{13}$, $C_{14}$ which arrive at multipliers $50_1$, $50_2$, $50_3$, $50_4$ which receive the neuron states $V_1$, $V_2$, $V_3$, $V_4$, respectively, stored in the shift register 12₁ which in this case forms the neuron state memory. These multipliers are connected to an adder tree 351 which delivers a result S so that:

$$S = C_{11} \cdot V_1 + C_{12} \cdot V_2 + C_{13} \cdot V_3 + C_{14} \cdot V_4.$$

Figure 5B:
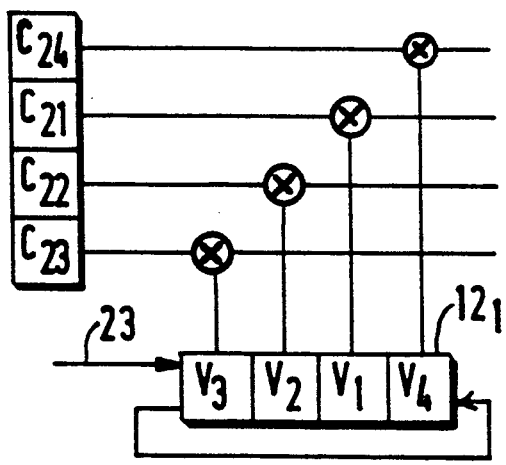
FIGS. 5B, 5C show two arrangements of data during the resolving and error backpropagation steps.

For a neuron 2 the arrangement will deliver the synaptic coefficients with a different arrangement is as shown in FIG. 5B. Before performing the calculation for the resolving step, the shift register 12₁ circulates the neuron states for correct assignment of each neuron state to its synaptic coefficient. The synaptic coefficient $C_{23}$ is associated with the state $V_3$, the synaptic coefficient $C_{22}$ being associated with the state $V_2$ and so on.

Figure 5C:
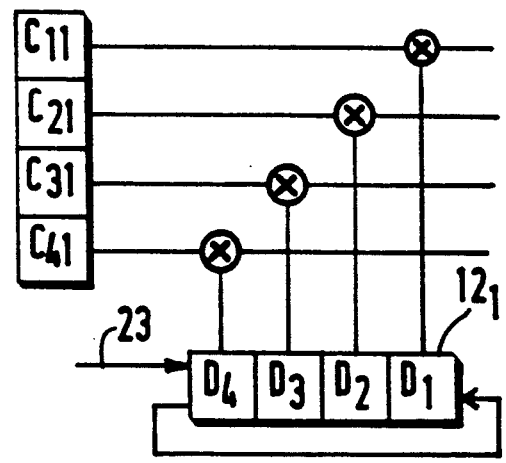

FIG. 5C concerns the training step. Actually, in this case the synaptic coefficients are read according to the transposed matrix: $C_{11}$, $C_{21}$, $C_{31}$, $C_{41}$. In this case the register 12₁ no longer contains the neuron states but the errors $D_1$, $D_2$, $D_3$, $D_4$ in order to execute the error backpropagation algorithm. The same circulation mechanisms are used for assigning the data. Thus, the customary register which stores the neuron states is transformed into a circulation shift register in order to enable adaptation to the permuted synaptic coefficient words supplied by the arrangement.

However, the circulation mechanism cannot be realized by the shift register, the coefficients being stored in temporary registers which are loaded by multiplexers comprising N channels (for N synaptic coefficients) which restore the correct order of the coefficients.

In the case where no random access to the neurons takes place but rather sequential access in the order: neuron 1, followed by the neuron 2, followed by the neuron 3 etc., after each evaluation of the neurons a shift takes place in the shift register containing either the neuron states or the errors, these terms thus corresponding each time with the synaptic coefficients whereby they are weighted. At the end of N calculations, the starting position is reached again.

In a circuit where the states are encoded on m bits and where the multipliers also perform multiplications by m--bits terms, the shift register is formed by m identical shift registers, each of which has one of the weights for the representation of the states.

In a circuit where the states are encoded on m bits and where the multipliers perform multiplications on 1 bit (using, for example, AND-gates or exclusive-OR gates), m cycles are required for calculating the weighted sum for a neuron. In this case the shift register comprises N*m positions and performs a shift after each bit calculation.

We claim:

1. Data handling system comprising
   a plurality of selectable cells for, upon selection, communicating data with an environment, and
   selection means for selecting a group of cells for establishing parallel couplings between the selected cells and a single data bus, wherein
   each particular cell belongs at least to a respective first group of cells selectable in a first selection mode and to a respective second group of cells selectable in a second selection mode, said groups having only the particular cell in common,
   the selection means transmits at least a first and second selection signal for controlling each coupling and the data bus, and thereby specifying groups of cells and the selection modes.

2. Data handling system as claimed in claim 1 wherein the plurality of cells is organized according to a main matrix of at least two dimensions, characterized in that the first group includes cells that are arranged in a one-dimensional first submatrix comprised in the main matrix, and the second group includes cells that form a diagonal of at least a single, at least two-dimensional second submatrix having an equal number of cells along all of its dimensions and being included in the main matrix.

3. Data handling system as claimed in claim 1 or 2, characterized in that each coupling comprises a series arrangement of switches, each being controlled by a respective selection signal.

4. Data handling system as claimed in claim 1 or 2, characterized in that the coupling for each cell includes a switch that is controlled by a further selection signal representative of a logic function of said first and second selection signals.

5. Data handling system as claimed in claim 2,
   wherein the plurality of cells forms a memory for storing a data matrix, and
   further comprising rearrangement means, coupled to said data bus, for, in accordance with a predetermined pattern, rearranging the data transmitted over said parallel couplings, said rearrangement means, in the first selection mode, enabling a row-wise or column-wise data communication with respect to the data matrix, and in the second selection mode, enabling a row-wise or a column-wise data communication with respect to the transposed data matrix, said pattern depending on the selected mode.

6. Neural net comprising a data handling system as claimed in claim 5, wherein the memory stores a synaptic coefficient matrix.

* * * * *